United States Patent
Lin et al.

[11] Patent Number: 5,913,124
[45] Date of Patent: Jun. 15, 1999

[54] METHOD OF MAKING A SELF-ALIGNED SILICIDE

[75] Inventors: Tony Lin, Kao Hsiung Hsien; Water Lur, Taipei, both of Taiwan

[73] Assignee: United Microelectronics Corporation, Taiwan

[21] Appl. No.: 08/883,332

[22] Filed: Jun. 26, 1997

[30] Foreign Application Priority Data

May 24, 1997 [TW] Taiwan ................................. 86107014

[51] Int. Cl.⁶ ................................................. H01L 21/336
[52] U.S. Cl. ........................... 438/302; 438/305; 438/299; 438/683; 438/592
[58] Field of Search .................................... 438/302, 305, 438/649, 683, 660, 666, 669, 682, 299, 308, 592

[56] References Cited

U.S. PATENT DOCUMENTS

| | | | |
|---|---|---|---|
| 5,534,449 | 7/1996 | Dennison et al. | 438/302 |
| 5,580,799 | 12/1996 | Funaki | 438/302 |
| 5,674,764 | 10/1997 | Liu et al. | 438/302 |
| 5,683,921 | 11/1997 | Nishio et al. | 438/302 |
| 5,686,324 | 11/1997 | Wang et al. | 438/302 |
| 5,759,901 | 6/1998 | Loh et al. | 438/305 |
| 5,793,090 | 8/1998 | Gardner et al. | 438/302 |
| 5,811,340 | 9/1998 | Park | 438/302 |
| 5,814,545 | 9/1998 | Seddon et al. | 438/305 |

OTHER PUBLICATIONS

Wolf et al., "Silicon Processing For The VLSI Era", vol. I, Lattice Press, 1986, pp. 292–294, 1986.
Wolf et al., "Silicon Processing For The VLSI Era", vol. II, Lattice Press, 1990, pp. 273–276, 1990.

*Primary Examiner*—John F. Niebling
*Assistant Examiner*—Lynne A. Gurley
*Attorney, Agent, or Firm*—Rabin & Champagne, P.C.

[57] ABSTRACT

A method of making a self-aligned silicide which has an impurity diffusion region in a lower part of the source/drain regions adjacent to the isolating region. The method includes performing an ion implantation operation at a large tilt angle, which increases the junction depth of the source/drain regions and prevents the metallic silicide lying at the edge of the isolating region from getting too close to the source/drain junction and causing unwanted current leakages. The isolating regions are overetched, which exposes the surface of the source/drain regions. The metal silicide layer can thus be formed over the exposed source/drain surfaces, resulting in more surface area for the formation of a wide border contact window, resulting in a lowering of both contact resistance and sheet resistance there.

10 Claims, 4 Drawing Sheets

METHOD OF MAKING A SELF-ALIGNED SILICIDE

BACKGROUND OF THE INVENTION

1. Field of Invention

This invention relates to a method of making a self-aligned silicide (salicide). More particularly, the present invention relates to a method of making a salicide layer that can counteract unwanted junction current leakages.

2. Description of Related Art

As a MOS component's level of integration is increased, resistance in the source/drain terminals of the MOS component will gradually increase to a level comparable to the channel resistance of the MOS component. To ensure integrity between the metal and the shallow junction of the MOS component, and to lower the sheet resistance in the source/drain terminals, self-aligned silicide is currently used in the manufacturing of semiconductor components whenever a line width is less than about 0.5 μm.

FIGS. 1A through 1E show the manufacturing progression of a self-aligned silicide layer according to a conventional method. Referring to FIG. 1A, a substrate 10 is provided. At least one MOS component region 11 is provided over substrate 10. MOS component region 11 includes a gate region 12, lightly doped drain (LDD) regions 12a, and isolating regions 13. The isolating regions 13 can be a shallow trench isolation (STI) region formed using a field oxide layer, for example, as shown in the illustration.

An insulating layer 14, for example, a silicon dioxide layer or a silicon nitride layer, is formed over the substrate 10. Then, an overetching process is performed, in which the insulating layer 14 is overetched to form spacers 15 on the two sidewalls of the gate region 12. The spacers 15 have a height slightly below an upper level of the gate region 12. During the overetching process, an upper layer of the isolating regions 13 will also be removed. Thereafter, using the spacers 15 and gate region 12 as masks, the substrate 10 is doped to form source/drain regions 16, thus forming the structure shown in FIG. 1B.

Subsequently, and referring to FIG. 1C, a metallic layer 17, for example, a titanium layer, is formed over the aforementioned structure. Next, rapid thermal processing (RTP) is performed, during which the metallic layer 17 reacts with a polysilicon at the top surfaces of the gate region 12 and the source/drain regions 16. This reaction forms a metal silicide layer 18 which extends to the isolating regions 13 adjacent to the source/drain regions 16. Thereafter, wet etching is used to remove any unreacted portion of metallic layer 17, thus forming a cross-sectional structure as shown in FIG. 1D.

Referring to FIG. 1E, a dielectric layer 19, for example, a silicon dioxide layer, is formed over the aforementioned structure. Then, the dielectric layer 19 is patterned to form a contact window 20. Contact window 20 exposes the metal silicide layer 18 located on top of the source/drain region 16. Additionally, contact window 20 exposes a portion of the isolating region 13. This completes the manufacturing of the self-aligned silicide layer using the conventional method.

In order to reduce the line width of the metal silicide layers, while maintaining an effective line width over the source/drain regions and gate region, the aforementioned conventional method requires overetching of the spacers. However, the overetching process also etches away part of an upper silicon dioxide layer of the isolating regions 13. Moreover, locating the metal silicide layer 18 at the corner of the isolating region 13, and so near to the junction of the source/drain regions 16, will generate undesired current leakages. As a result, component malfunctions will occur. This problem is especially serious with submicron components having a shallow junction.

SUMMARY OF THE INVENTION

It is an object of this invention to provide a method of making a self-aligned silicide that uses a tilt angle in the implantation of ions into the source/drain regions, so as to increase a junction depth of the source/drain regions at a corner next to the isolating region, thus avoiding the generation of undesired current leakages.

A further object of this invention is to provide a method of making a self-aligned silicide that increases the size of a contact window, so as to lower contact resistance and sheet resistance of the metal silicide formation.

To attain these objects and advantages, and in accordance with the purpose of the invention, as embodied and broadly described herein, the invention comprises a method of manufacturing a self-aligned silicide, which includes providing a type one substrate having at least a MOS component region there above. The MOS component region comprises a gate region, lightly doped source/drain regions and an isolating region. A first insulating layer is deposited above the substrate surface. Anisotropic overetching is used to remove the first insulating layer and form spacers on the sidewalls of the gate region. At the same time, part of the upper layer in the isolating region is also removed. Using the spacers and gate region as masks, type two ions are implanted into the substrate at a tilt angle, to form a plurality of source/drain regions in the substrate on each side of the gate. A metallic layer is formed over the surfaces of the aforementioned layers. Using rapid thermal processing, the metallic layer is caused to react with a silicon on a top surface of the gate region and the source/drain regions. Subsequently, using selective etching, the unreacted metallic layer is removed. A second insulating layer and a dielectric layer are sequentially formed above the surfaces. A pattern is then defined on the dielectric layer, using the second insulating layer as an etching stop, to form a plurality of wide border contact windows. The second insulating layer is removed through the wide border contact windows so as to expose the metal silicide, thereby providing the self-aligned silicide according to the invention.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

FIGS. 2A through 2F show the manufacturing progression of a self-aligned silicide according to one preferred embodiment of this invention. In this embodiment, a P-type silicon substrate is used for illustrative purposes. However, the invention is equally applicable when an N-type silicon substrate is used.

Figure 1A:
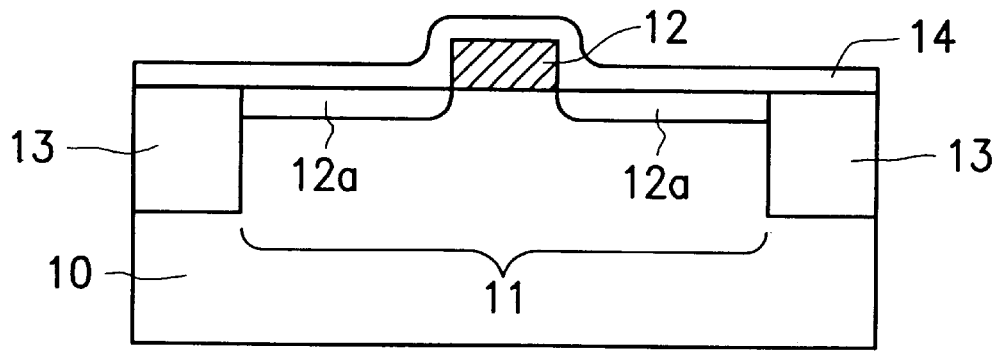
FIGS. 1A through 1E show the manufacturing progression of a self-aligned silicide according to a conventional method.
Figure 1B:
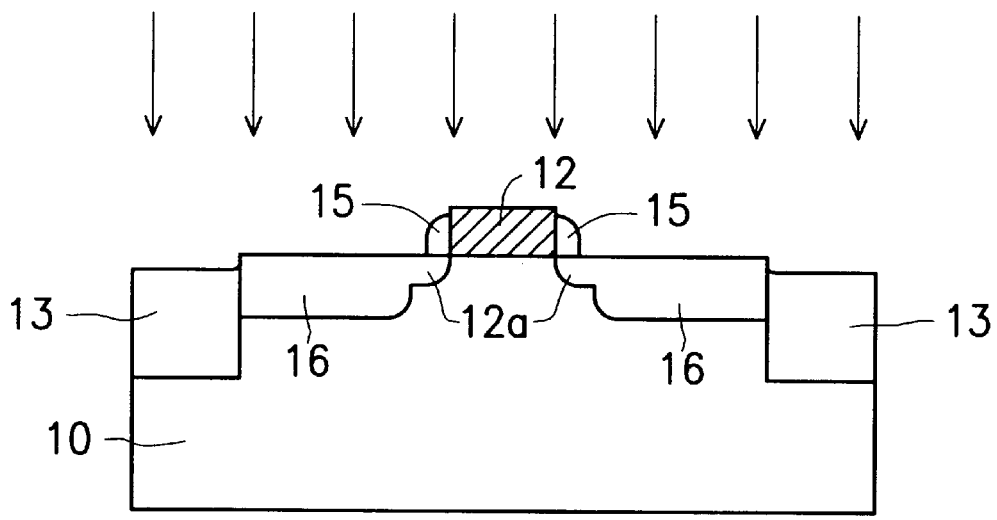
Figure 1C:
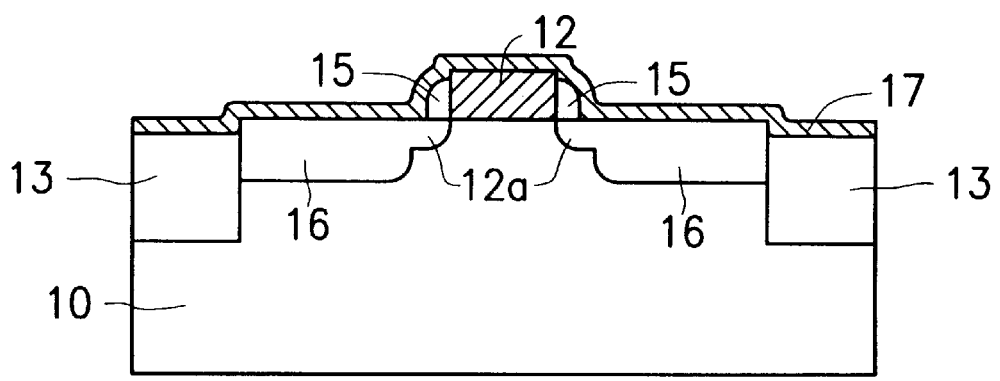
Figure 1D:
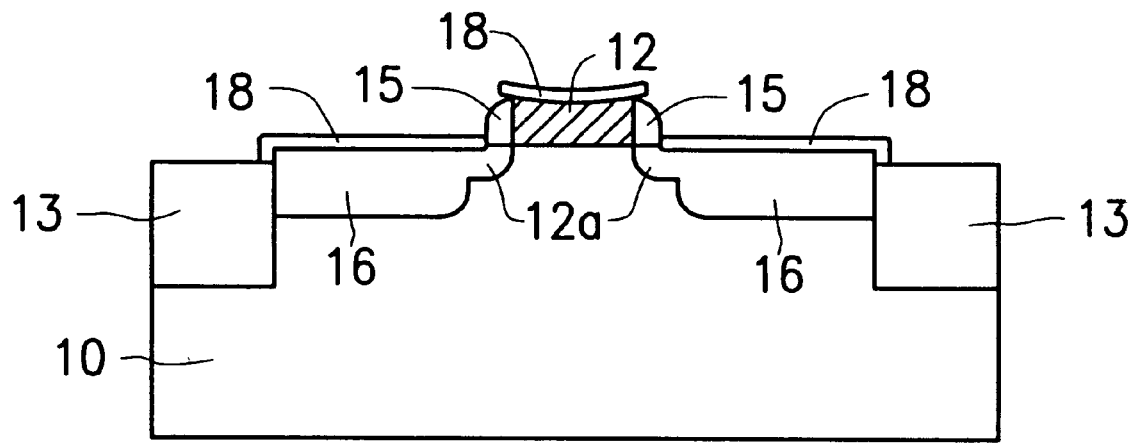
Figure 1E:
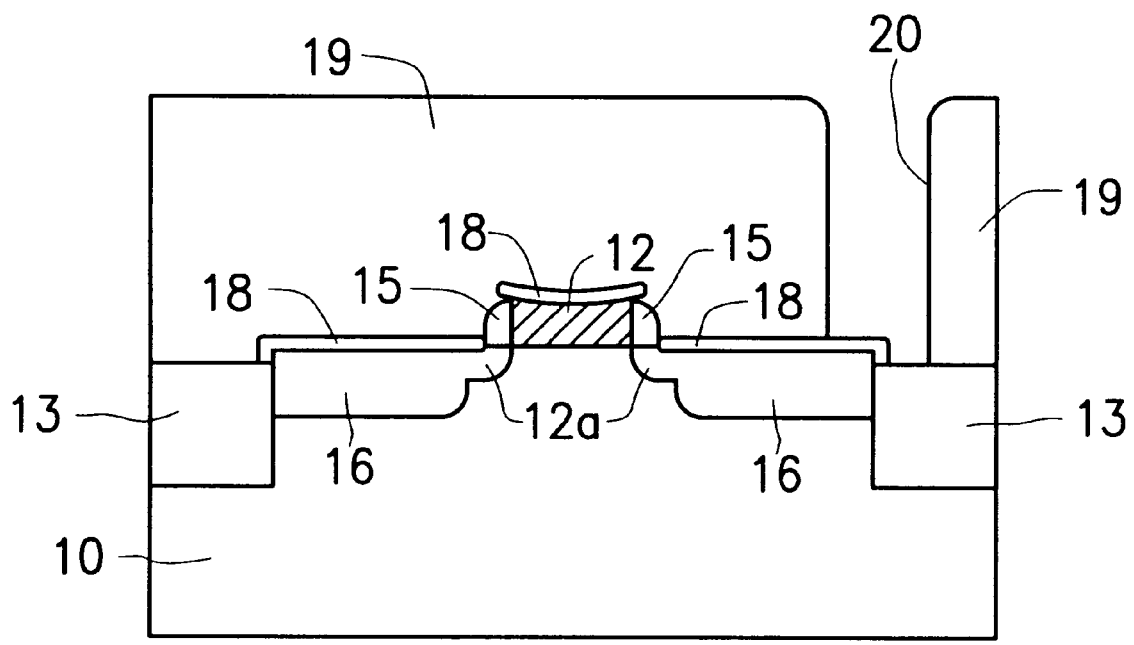
Figure 2A:
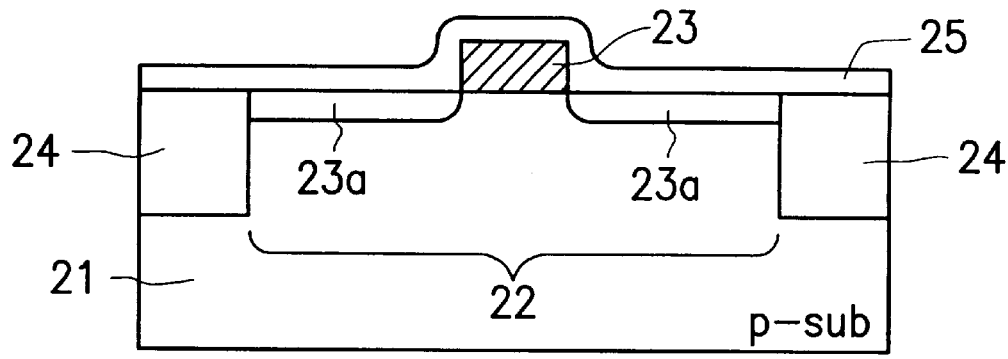
FIGS. 2A through 2F show the manufacturing progression of a self-aligned silicide according to the present invention.

Referring to FIG. 2A, a substrate 21, for example, a P-type silicon substrate having at least a MOS component region 22 thereabove, is provided. The MOS component region 22 includes a gate region 23, lightly doped regions 23a and isolating regions 24. The isolating regions 24 can be, for example, a shallow trench isolation region comprised of silicon dioxide, or a field oxide layer. In this embodiment, a shallow trench isolation region is used for illustration purposes.

Figure 2B:
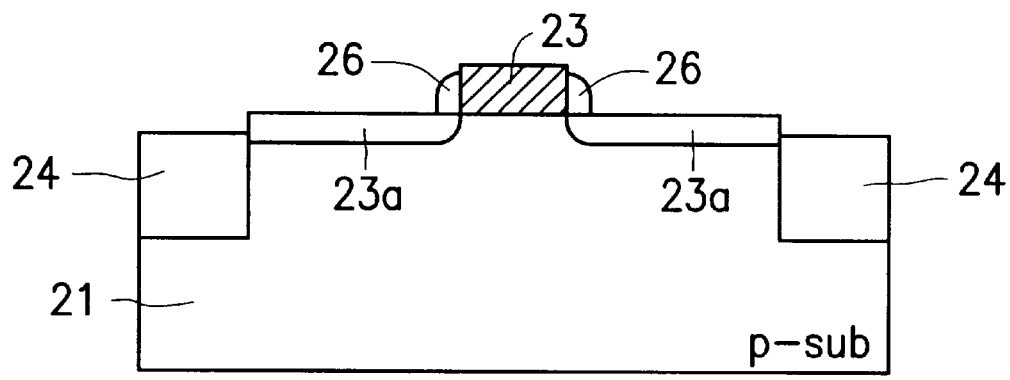

Next, an insulating layer 25 is formed over the substrate 21 using, for example, chemical vapor deposition. The insulating layer 25 can be, for example, a silicon oxide layer or a silicon nitride layer. Then, anisotropic overetching is performed to remove most of the insulating layer 25, thereby forming spacers 26 on sidewalls of the gate region 23. The spacers 26 have a height which is slightly lower than a height of the gate region 23. During the overetching procedure, an upper layer of the isolating regions 24 will also be removed. This increases a contact area of the MOS component region 22, and results in the structure as shown in FIG. 2B.

Figure 2C:
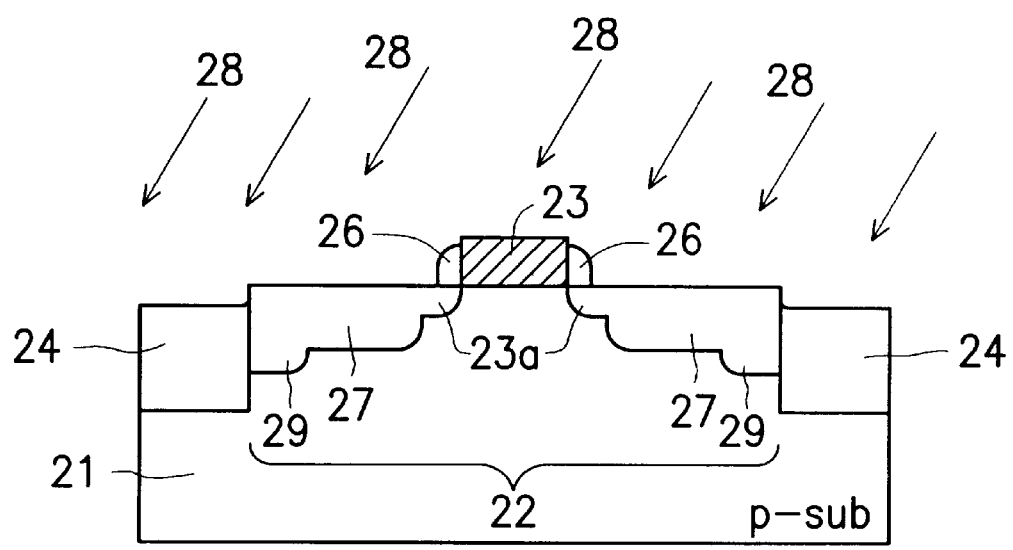

Thereafter, and referring to FIG. 2C, the spacers 26 and gate region 23 are used as masks. Ions, for example, N-type ions, are implanted at a tilt angle into the MOS component region 22 to form source/drain regions 27. This will increase the junction depth of the source/drain regions 27. The tilt can be accomplished, for example, by positioning the substrate 21 at an angle with respect to an implantation direction of the ions, as shown by arrows 28. Implanting can occur while spinning the substrate. As a result of the tilt, an impurity diffusion region 29 will be formed in the source/drain regions 27, adjacent to a lower part of the isolating regions 24. The implanting ions can thus pass through an area at an outer edge of the MOS component region 22 neighboring the isolating region 24, due to the tilt, and the prior removal of the upper layer of the isolating regions 24.

Figure 2D:
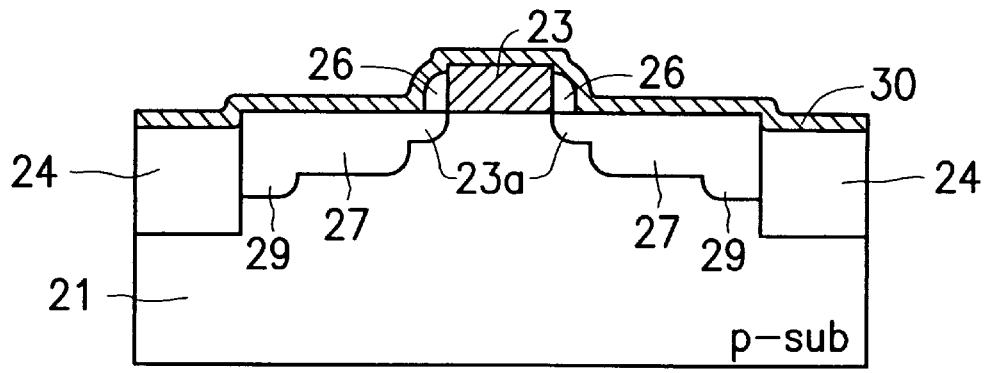
Figure 2E:
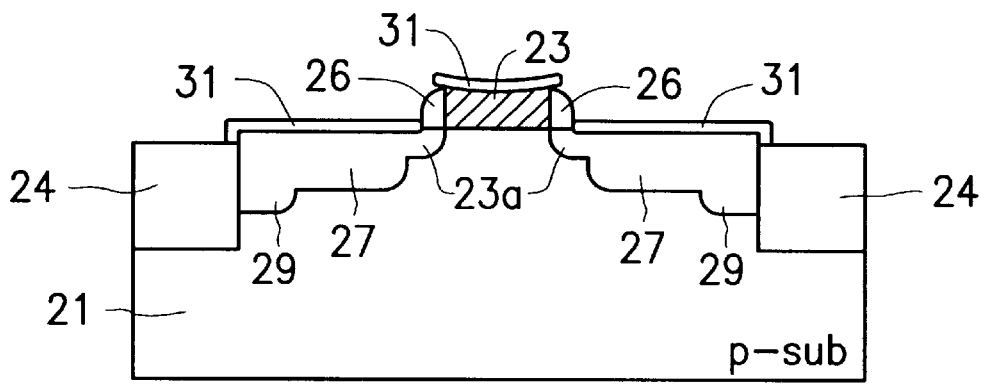

Referring next to FIG. 2D, a metallic layer 30, for example, a titanium layer, is formed above the aforementioned structure. Subsequently, rapid thermal annealing is performed, causing metallic layer 30 to react with silicon on a top surface of the gate region 23 and the source/drain regions 27, thereby forming a self-aligned metal silicide layer 31. The annealing operation provides for a larger area occupation of the metal silicide layer 31. Thereafter, wet etching is used to remove any unreacted portion of the metallic layer 30, resulting in a structure as shown in FIG. 2E.

Figure 2F:
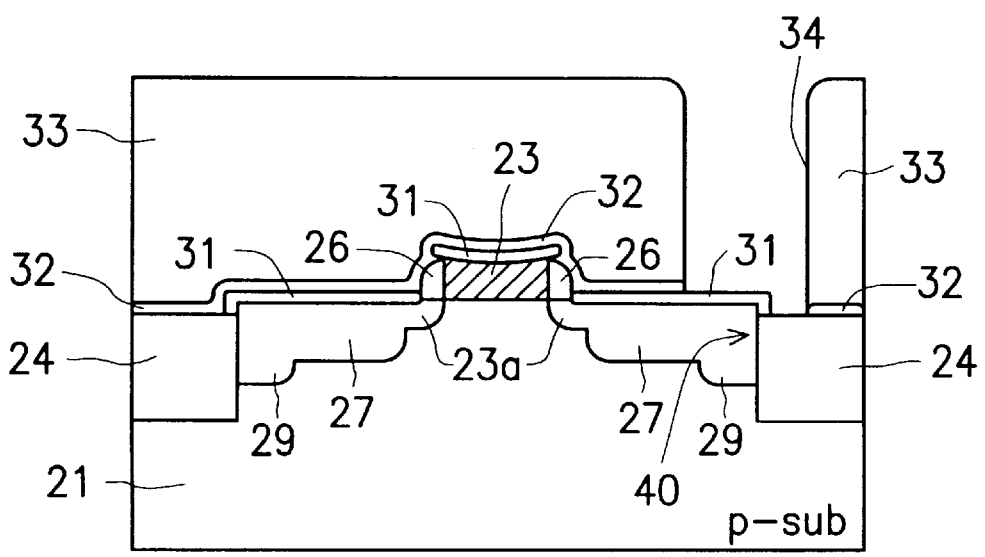

Referring to FIG. 2F, an insulating layer 32 and a dielectric layer 33 are sequentially formed above the surfaces of the structure. The insulating layer 32 can be, for example, a silicon nitride layer, and the dielectric layer 33 can be, for example, a silicon oxide layer. Next, the dielectric layer 33 is patterned using the insulating layer 32 as an etching stop layer. Thereafter, the exposed portions of the insulating layer 32 are removed to form a wide border contact window 34, thereby exposing the metal silicide layer 31. Subsequent processing operations are conventional, and so detailed descriptions are omitted herein.

The method of forming a self-aligned silicide layer according to the present invention has at least the following advantages:

(1) The formation of an impurity diffusion region in a lower part of the source/drain regions and adjacent to the isolating region by using a large tilt angle ion implantation operation increases the junction depth of the source/drain regions. The metal silicide located at an edge of the isolating region is thus prevented from getting too close to the source/drain junction, as shown by the arrow 40 in FIG. 2F, thereby preventing undesired current leakages.

(2) The metal silicide layer can be formed over the surfaces of the source/drain regions, which were exposed through a prior overetching procedure of the isolating regions. Therefore, more surface area is available for the wide border contact window, which results in a lowering of both the contact resistance and the sheet resistance there.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of manufacturing a self-aligned silicide, comprising:

providing a first conductivity type substrate having at least a MOS component region thereabove, with the MOS component region including a gate region, lightly doped regions and isolating regions;

depositing a first insulating layer above a surface of the substrate;

anisotropic overetching the first insulating layer to remove the first insulating layer and form spacers on a respective sidewalls of the gate region, and to simultaneously remove a portion of an upper layer of the isolating regions;

implanting second conductivity type ions at a tilt angle into the MOS component region while spinning the substrate, using the spacers and gate region as masks, to form a plurality of source/drain regions in the substrate on each side of the gate region, each source/drain region being formed with a second conductivity type impurity diffusion region located immediately adjacent to a respective one of the isolating regions and having a junction depth that is greater than a depth of all other portions of the respective source/drain region;

forming a metallic layer over a surface of the substrate, the MOS component region and spacers;

performing rapid thermal processing to cause the metallic layer to react with a silicon on a top surface of the gate region and the source/drain regions and form a metal silicide layer;

subsequent to said performing, selectively etching to remove any unreacted portion of the metallic layer;.

sequentially forming a second insulating layer and a dielectric layer above a surface of the substrate, the MOS component region, the spacers and the metal silicide layer;

patterning the dielectric layer, using the second insulating layer as an etching stop, to form a plurality of wide border contact windows; and removing the second insulating layer through the wide border contact windows so as to expose the metal silicide layer.

2. The method according to claim 1, wherein said providing includes providing a P-type substrate, and said implanting includes implanting N-type ions.

3. The method according to claim 1, wherein said providing includes providing an N-type substrate, and said implanting includes implanting P-type ions.

4. The method according to claim 1, wherein said providing includes comprising the isolating regions of a shallow trench isolation region.

5. The method according to claim 1, wherein said providing includes comprising the isolating regions of a field oxide layer.

6. The method according to claim 1, wherein said depositing a first insulating layer includes comprising the first insulating layer of silicon oxide.

7. The method according to claim 1, wherein said depositing a first insulating layer includes comprising the first insulating layer of silicon nitride.

8. The method according to claim 1, wherein said forming includes comprising the metallic layer of titanium.

9. The method according to claim 1, wherein said sequentially forming includes comprising the second insulating layer of silicon nitride.

10. The method according to claim 1, wherein said sequentially forming includes comprising the dielectric layer of silicon oxide.

* * * * *